(12) United States Patent
Jung et al.

(10) Patent No.: US 7,744,328 B2
(45) Date of Patent: Jun. 29, 2010

(54) APPARATUS FOR ALIGNING A TRAY AND TRAY HOLDER

(75) Inventors: Sung Wha Jung, Suwon (KR); Sang Jin Han, Suwon (KR); Eu Gene Kang, Suwon (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1123 days.

(21) Appl. No.: 11/324,609

(22) Filed: Jan. 4, 2006

(65) Prior Publication Data

US 2006/0196802 A1 Sep. 7, 2006

(30) Foreign Application Priority Data

| Jan. 5, 2005 | (KR) | ....................... 10-2005-0000948 |
| Jan. 5, 2005 | (KR) | ....................... 10-2005-0000952 |
| Jan. 5, 2005 | (KR) | ....................... 10-2005-0000953 |

(51) Int. Cl.
   *B65G 53/46* (2006.01)
(52) U.S. Cl. ....................... 414/219; 118/719
(58) Field of Classification Search ................. 118/719, 118/728, 729, 730; 156/345.31, 345.32, 156/345.51, 345.54; 250/492.1; 315/111.21, 315/427, 438, 216; 29/740; 414/219
   See application file for complete search history.

(56) References Cited

U.S. PATENT DOCUMENTS 4,544,317 A * 10/1985 Carter ........................ 414/217

| 6,370,765 | B1 * | 4/2002 | Hiramoto et al. ............... 29/740 |
| 6,839,959 | B1 * | 1/2005 | Hosotani et al. ............... 29/740 |
| 6,941,647 | B2 | 9/2005 | Cho et al. |
| 2003/0172874 | A1 | 9/2003 | Kawaguchi |

FOREIGN PATENT DOCUMENTS

| JP | 02-207546 | 8/1990 |
| JP | 2002-237514 | 8/2002 |
| JP | 2003-133386 | 5/2003 |

OTHER PUBLICATIONS

Chinese Office Action dated Mar. 13, 2009.

* cited by examiner

*Primary Examiner*—Korie Chan
(74) *Attorney, Agent, or Firm*—H.C. Park & Associates, PLC

(57) ABSTRACT

An apparatus for aligning a tray and tray holder, including a vertically positioned tray formed with coupling holes and a tray holder having coupling arms to couple with the coupling holes, and to prevent the bending of the tray and the tray holder. The tray includes a substrate frame that can receive a substrate, and the tray holder is coupled with a drive shaft for transferring the tray in the vertical position to a mask for vapor deposition. One end of a plurality of guide shafts securely contacts the rear side of the tray holder to prevent bending of the tray holder. The tray can have magnetic attaching members and the tray holder can have supporting members corresponding to the attaching members. The supporting members can magnetically couple with the attaching members in a position determined by corresponding grooves or protrusions to align the tray and tray holder.

25 Claims, 18 Drawing Sheets

APPARATUS FOR ALIGNING A TRAY AND TRAY HOLDER

CROSS REFERENCE TO RELATED APPLICATIONS

This application claims priority to and the benefit of Korean Patent Application No. 2005-0000948, No. 2005-0000952, and No. 2005-0000953, all filed on Jan. 5, 2005, which are hereby incorporated by reference for all purposes as if fully set forth herein.

BACKGROUND OF THE INVENTION

1. Field of the Invention

The present invention relates to a tray and tray holder aligning apparatus, and more particularly, to a tray and tray holder aligning apparatus, including a vertically positioned tray with a coupling hole and a holder plate with a coupling arm coupled with the coupling hole.

2. Discussion of the Background

Generally, an electric field light emitting display, which is a type of flat panel display, can be categorized as either a non-organic electroluminescent display or an organic electroluminescent display depending on the material used in a light emitting layer. Because an organic electroluminescent display can be driven with lower voltages, and is generally light, thin with a wide viewing angle and fast response speed for displaying images, organic electroluminescent display technology has been heavily developed.

An organic electroluminescence device of the organic electroluminescent display includes a positive electrode laminated on a substrate, an organic material layer, and a negative electrode. The organic material layer emits light by combining holes and electrons. To efficiently transfer the holes and electrons to the organic light emitting layer, an electron injection layer and an electron transfer layer may be interposed between the negative electrode and the organic light emitting layer, and a hole injection layer and an electron transfer layer may be interposed between the positive electrode and the organic light emitting layer. Thus, luminescent efficiency may be improved.

An organic luminescence device with the above described structure can be manufactured by physical vapor deposition such as vacuum deposition, ion plating, or sputtering, or by chemical vapor deposition using gas reaction. Particularly, to form the organic material layer of the organic luminescence device, vacuum deposition is often used. In vacuum deposition, the organic material is vaporized in a vacuum chamber to form vaporized organic material, and the vaporized organic material is then jetted and deposited on the substrate by a deposition source.

As flat panel displays have become larger, the sizes of the substrates in organic electroluminescent displays have become larger. Because positioning a larger substrate in a horizontal position for vacuum deposition may result in deflection of the substrate and defects in the deposited material, a vapor deposition system, in which a vapor deposition source moves in vertical direction in the vacuum chamber and injects the organic vaporized material on the substrate while in the vertical position, has been developed.

The vapor deposition system includes a driving shaft for moving the vapor deposition source in the vertical direction, and the driving shaft is rotated by a driving device. Due to the rotation of the driving shaft, the vapor deposition source injects the vaporized organic material, formed by evaporating the organic material, while moving vertically.

Moreover, as the substrate becomes larger, a vertical aligning system, in which the substrate and a mask are aligned while positioned vertically, is developing.

The vertical aligning system can include a substrate tray holder, which reciprocates such that the substrate is fixed in the vertical position. A holder plate with a coupling member, coupled with the substrate, can protrude and be positioned vertically. However, since the holder plate can be positioned vertically, deflection may occur.

Moreover, because the substrate and the mask are positioned vertically, a tray could be developed in which the erected substrate and the mask could be fixed and transferred vertically.

Additionally, to erect the substrate and the mask, a tray holder could be developed in which a tray is positioned vertically when transferred to a chamber for deposition.

SUMMARY OF THE INVENTION

This invention provides an apparatus for aligning a tray and tray holder, in which a substrate is fastened to the tray and a plurality of coupling holes having coupling protrusions are formed in the tray, the tray is transferred while positioned vertically; and a tray holder includes coupling arms for inserting into the coupling holes to couple the tray and tray holder in a desired alignment.

Additional features of the invention will be set forth in the description which follows, and in part will be apparent from the description, or may be learned by practice of the invention.

The present invention discloses an apparatus for aligning a tray and tray holder, including a tray capable of receiving a substrate, a plurality of coupling holes formed in the tray, one of the plurality of coupling holes having a coupling protrusion, a tray holder and a plurality of coupling arms coupled with the tray holder and extending away from the tray holder, one of the plurality of coupling arms corresponding to one of the plurality of coupling holes and having a coupling groove to engage the coupling protrusion. Further, the tray is coupled with the tray holder and can be transferred while positioned vertically when the coupling groove engages the coupling protrusion.

The present invention also discloses an apparatus for aligning a tray and tray holder, including a tray holder, to which a tray can be coupled to position the tray vertically, and a supporting member for supporting the tray when the tray is coupled with the tray holder.

The present invention also discloses an apparatus for aligning a tray and tray holder, including a driving unit in which a tray holder is coupled with one end of a movable shaft driven by a driving source, a coupling part including coupling arms, the coupling arms coupled with the tray holder and capable of coupling with a vertically positioned tray, and a first guide shaft. Further, a first end of the first guide shaft is coupled with the tray holder, and the guide is shaft prevents bending of the tray holder.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
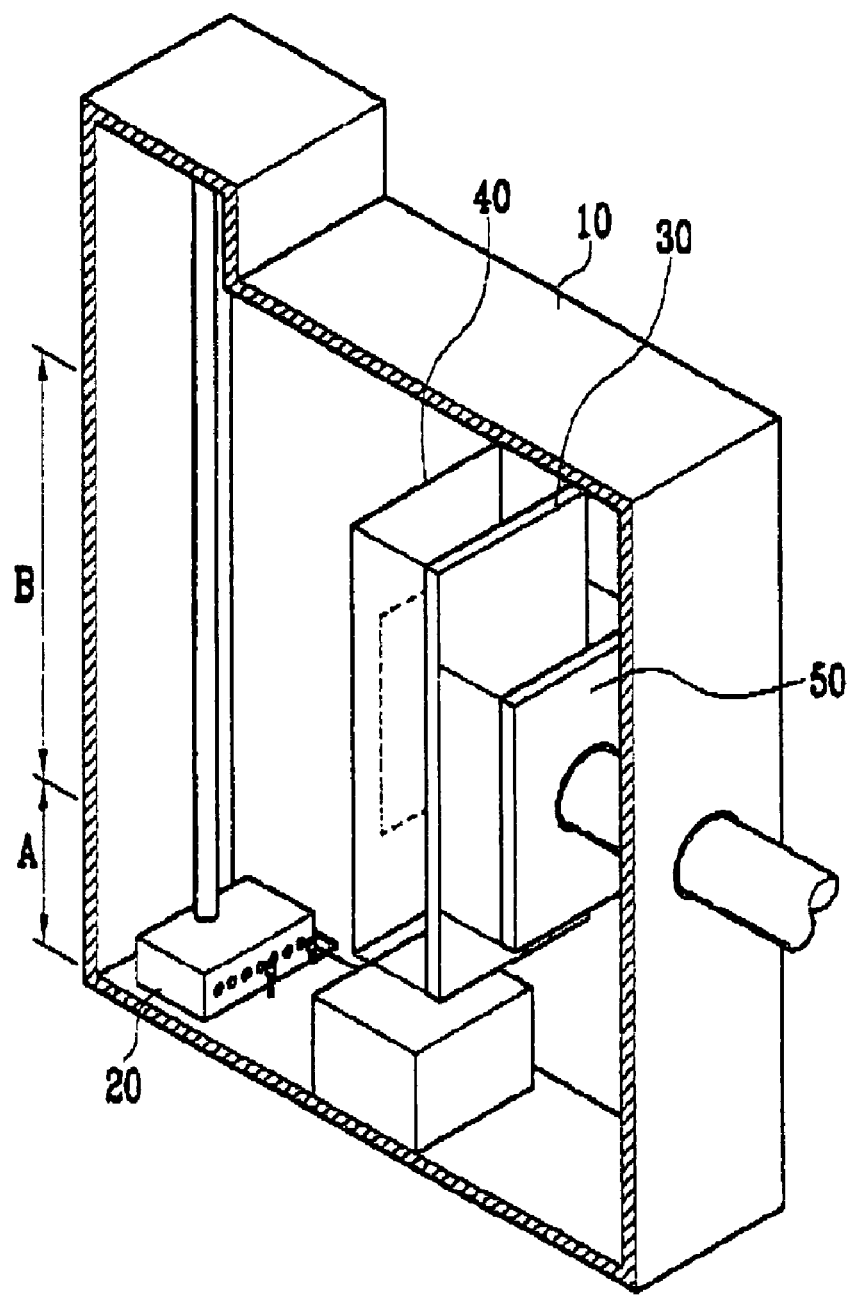
FIG. 1A shows a schematic view of a vapor deposition source positioned in a buffer region of a conventional vacuum vapor deposition system.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like numerals refer to the same or similar components on the Figures.

Figure 1B:
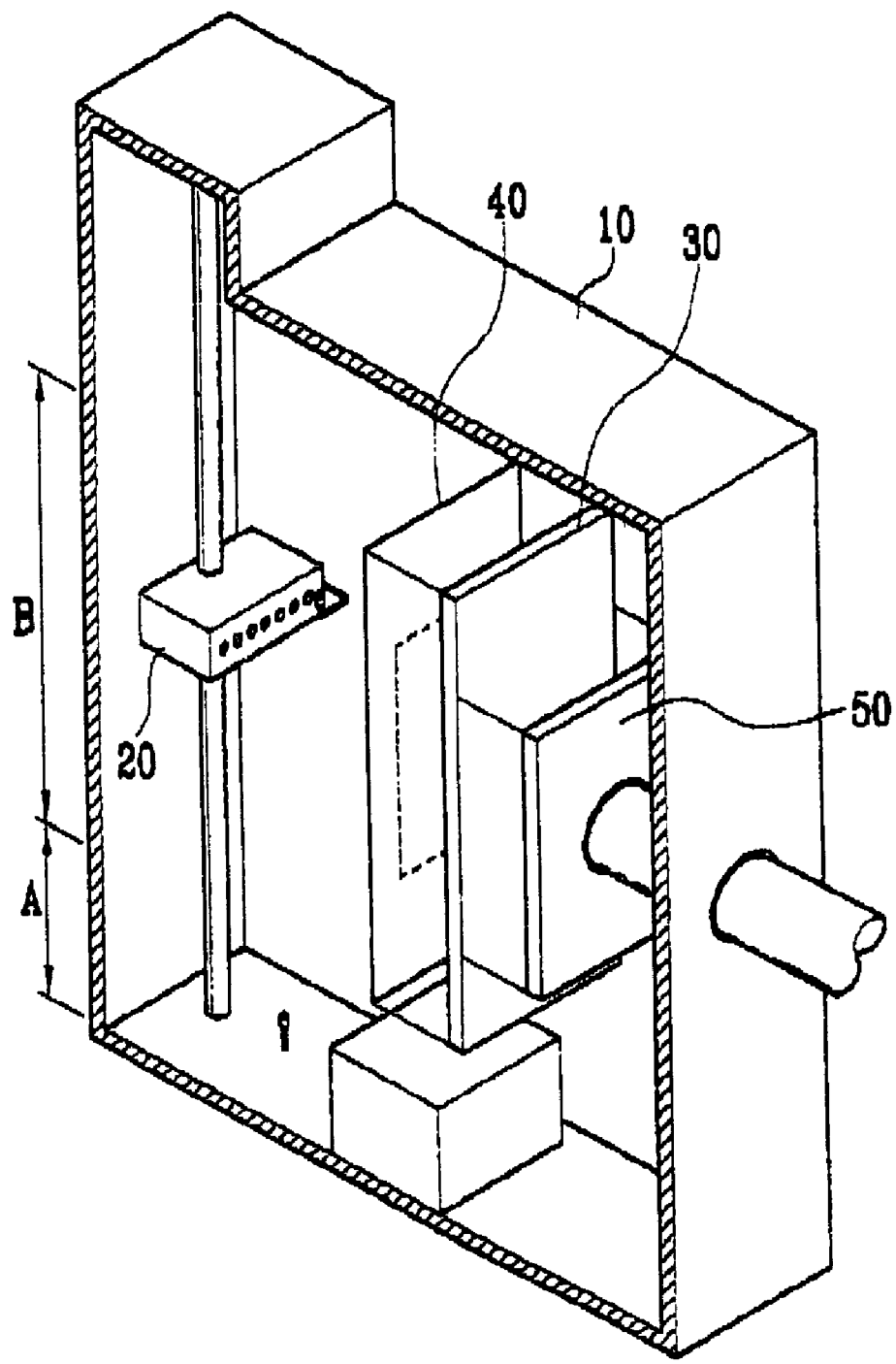
FIG. 1B shows a schematic view of a vapor deposition source positioned in a layer forming region of a conventional vacuum vapor deposition system.

FIG. 1A shows a schematic view of a vapor deposition source positioned in a buffer region of a conventional vacuum vapor deposition system. FIG. 1B shows a schematic view of a vapor deposition source positioned in a layer forming region of a conventional vacuum vapor deposition system.

Referring to FIG. 1A and FIG. 1B, a substrate 30 on which an organic material layer is formed, a mask 40 positioned at the front side of the substrate 30, and a vapor deposition source 20 separated from the mask are installed in a vacuum chamber 10 of a vacuum vapor deposition system. The mask 40 and the substrate 30 are aligned by an alignment system (not shown), are positioned adjacent to either contact or be separated by a small distance from each other, and are each fixed to a chuck 50.

The mask 40 includes a pattern forming part, shown inside the dashed line, in which a pattern corresponding to an organic material layer pattern to be formed on the substrate is formed, and a fixing part fixed to a mask frame (not shown) by a fastening method such as welding. The vacuum chamber 10 is divided into a layer forming region B, which corresponds to the position of the mask 40 and the substrate 30, and a buffer region A, which does not correspond to the position of the mask 40 or the substrate 30.

The vapor deposition source 20 is installed along a driving shaft rotated by a moving device (not shown), and the vapor deposition source 20 can move in the vertical direction within the vacuum chamber according to the rotation direction of the driving shaft.

Hereinafter, the tray aligning apparatus according to an embodiment of the present invention will now be described in detail with reference to the accompanying drawings.

Figure 2:
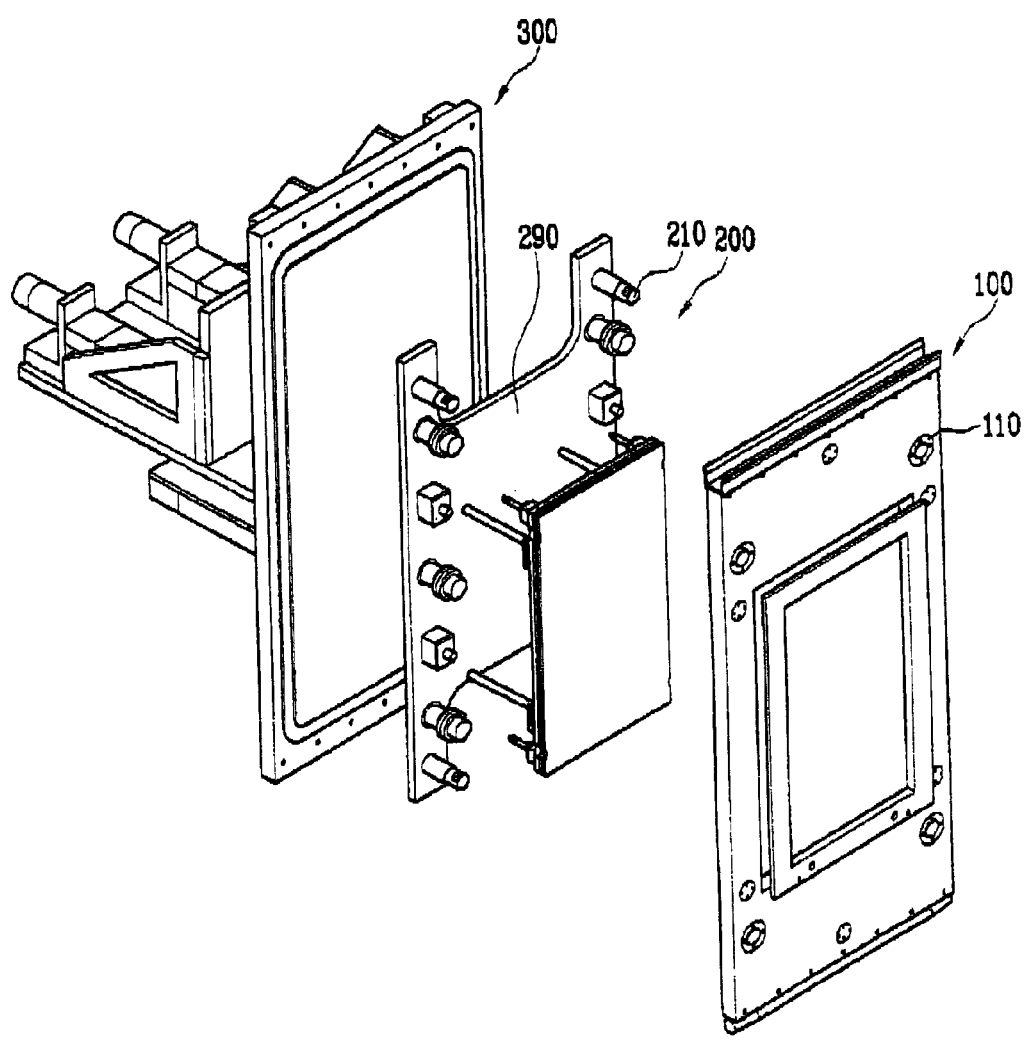
FIG. 2 shows a schematic perspective view of a tray aligning apparatus according to an embodiment of the present invention.
Figure 3A:
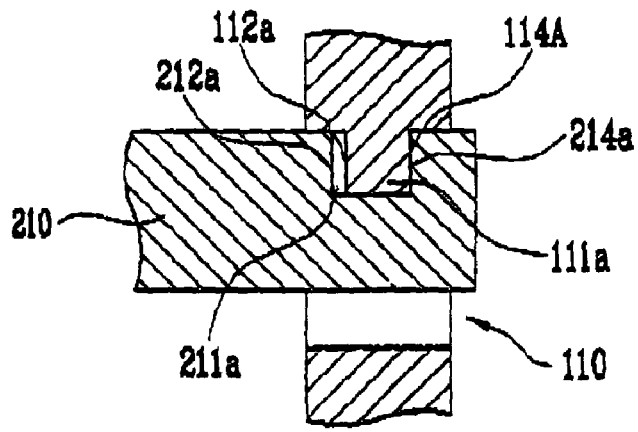
FIG. 3A shows a partial side sectional view of the tray aligning apparatus in FIG. 2 according to an embodiment of the present invention.
Figure 3B:
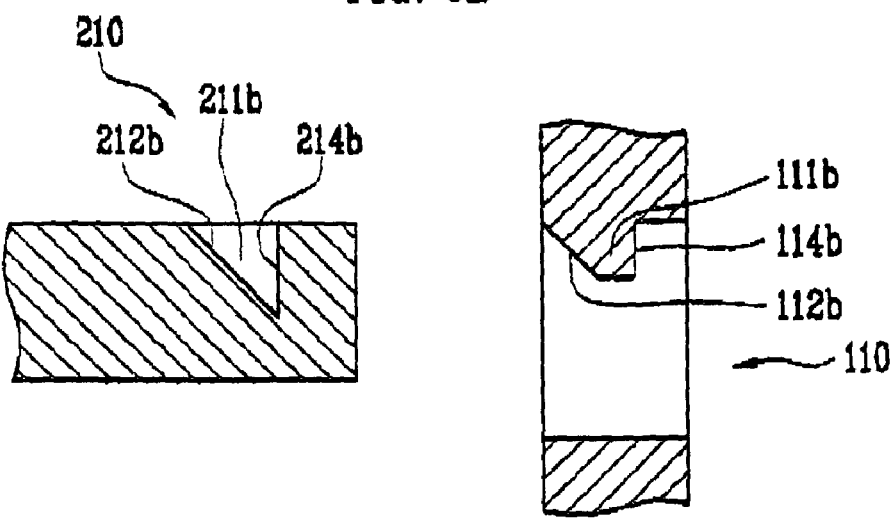
FIG. 3B shows a partial side sectional view of the tray aligning apparatus in FIG. 2 according to another embodiment of the present invention.
Figure 3C:
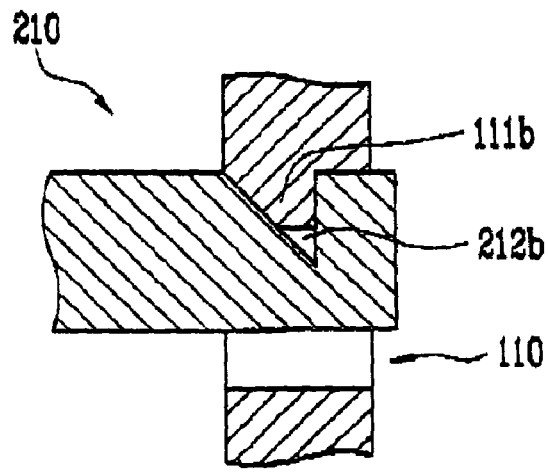
FIG. 3C shows a partial side sectional view of the tray aligning apparatus in FIG. 3B.

FIG. 2 shows a schematic perspective view of a tray aligning apparatus according to an embodiment of the present invention. FIG. 3A shows a partial side sectional view of the tray aligning apparatus in FIG. 2 according to an embodiment of the present invention. FIG. 3B shows a partial side sectional view of the tray aligning apparatus in FIG. 2 according to another embodiment of the present invention. FIG. 3C shows a partial side sectional view of the tray aligning apparatus in FIG. 3B.

As shown in FIG. 2 to FIG. 3C, the tray aligning apparatus includes a tray 100, transferred while positioned vertically and in which a substrate and a mask are fixed and a plurality of coupling holes 110 having coupling protrusions 111a, 111b is formed, and a tray holder 200 having a holder plate 290 and coupling arms 210. The coupling arms 210 can be inserted into the coupling holes 110, and coupling grooves 211a, 211b formed in the coupling arms 210 can engage with the coupling protrusions 111a, 111b after insertion.

In the coupling structure of the tray 100 and the tray holder 200, as shown in FIG. 3A, coupling grooves 211a, formed to have approximately vertical surfaces 212a and 214a along the outer upper sides of the coupling arms 210, are coupled with coupling protrusions 111a. Coupling protrusions 111a are formed with approximately vertical surfaces 112a and 114a that correspond to the vertical surfaces 212a and 214a formed in the coupling grooves 211a.

To facilitate coupling of the coupling grooves 211a and coupling protrusions 111a, the width of a coupling groove 211a is slightly greater than the width of a corresponding coupling protrusion 111a.

In another preferred embodiment of the tray 100 and the tray holder 200, as shown in FIG. 3B and FIG. 3C, the coupling arms 210 have coupling grooves 211b formed in the upper sides thereof and coupling protrusions 111b are formed in the coupling holes 110.

The coupling protrusions 111b extend downward from the upper portions of the coupling holes 110 so coupling protrusions a11b couple with the coupling grooves 211b due to the weight of the tray 100.

Moreover, a coupling protrusion 111b includes an incline surface 112b formed along one surface of the coupling protrusion 111b so the coupling protrusion 111b can be easily inserted into the coupling groove 211b. The coupling protrusion 111b can also include a vertical surface 114b formed along a surface opposite to the incline surface 112b.

The coupling groove 211b includes an incline surface 212b formed along one surface of the coupling groove 211b to slide on and contact the incline surface 112b of the coupling protrusion 111b, and a vertical surface 214b formed along a surface opposite to the incline surface 212b.

The coupling protrusion 111b and the coupling groove 211b, respectively having the incline surfaces 112b and 212b and the vertical surfaces 114b and 214b, engage each other after insertion of the coupling arm 210 in the coupling hole 110.

Figure 4A:
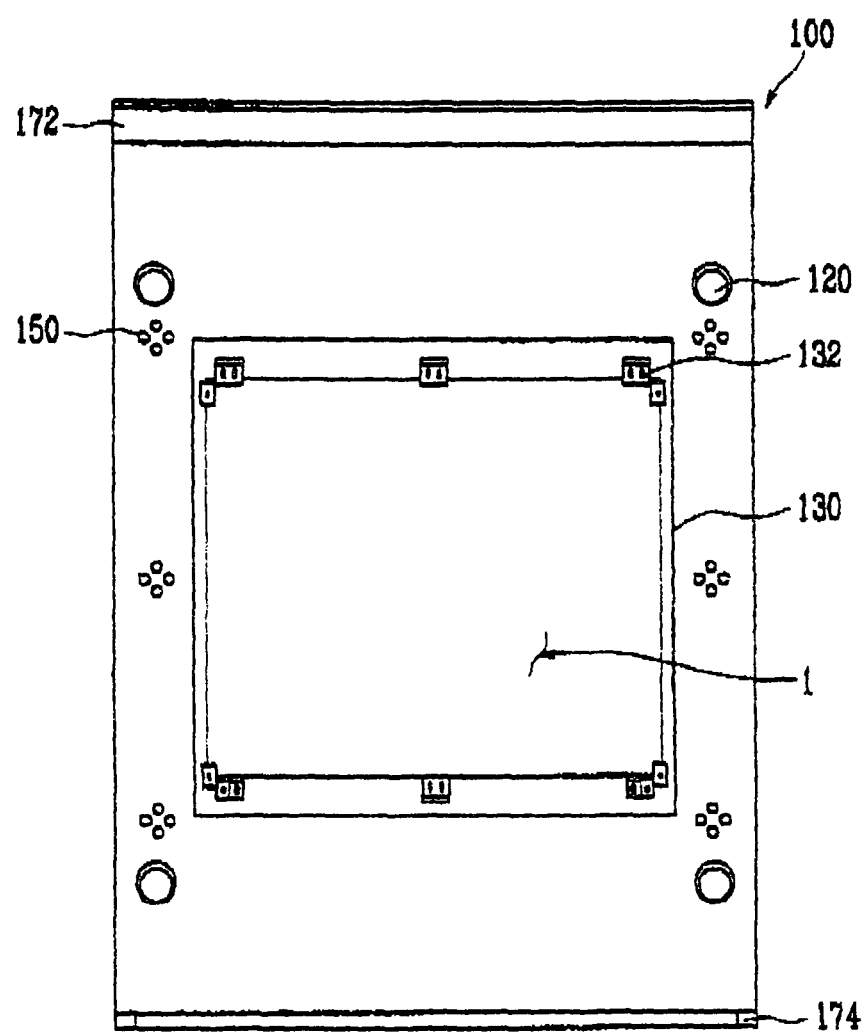
FIG. 4A shows a front view of a substrate supporting tray of a tray aligning apparatus according to an embodiment of the present invention.
Figure 4B:
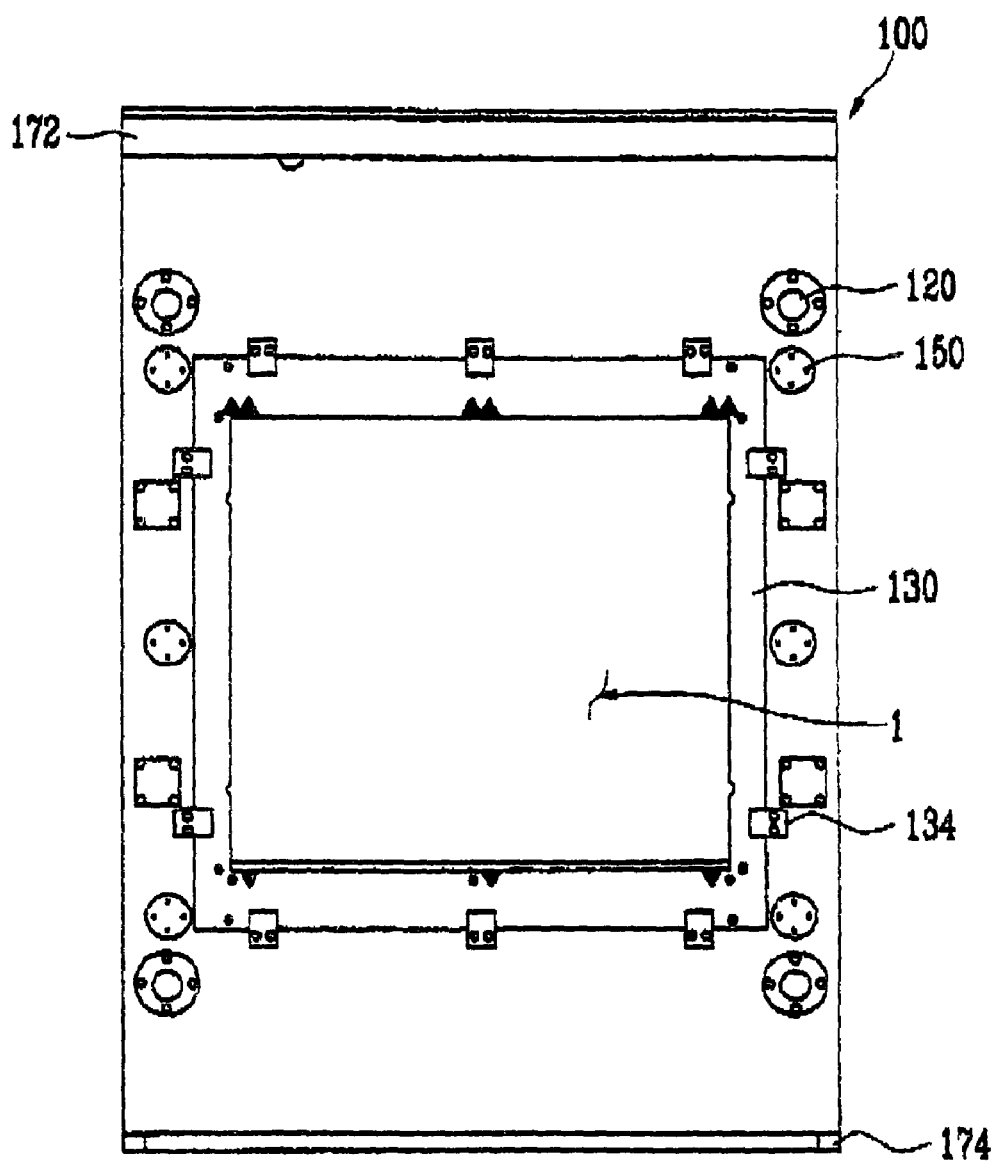
FIG. 4B shows a rear view of a substrate supporting tray of a tray aligning apparatus according to an embodiment of the present invention.

FIG. 4A shows a front view of a substrate supporting tray of a tray aligning apparatus according to an embodiment of the present invention. FIG. 4B shows a rear view of a substrate supporting tray of a tray aligning apparatus according to an embodiment of the present invention. FIG. C shows a side view of a substrate supporting tray of a tray aligning apparatus according to an embodiment of the present invention.

Figure 4C:
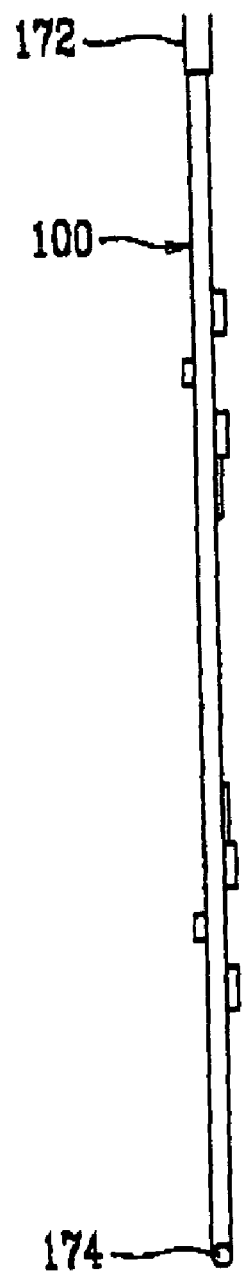
FIG. 4C shows a side view of a substrate supporting tray of a tray aligning apparatus according to an embodiment of the present invention.

Referring to FIG. 4A to FIG. 4C, a tray 100 of the tray aligning apparatus according to an embodiment of the present invention includes a substrate 1, on which material is deposited during vapor deposition, and at least one fixing holder member 120.

The tray 100 includes frame fixing pieces 134 to fix the position of the substrate frame 130. The substrate frame 130 includes substrate fixing pieces 132 to fix the position of the substrate 1. A transferring device 174 is formed along the lower edge of the tray 100 for transferring the substrate 1 within the vacuum chamber. A guide 172 for guiding the transfer is formed along the upper side surfaces of the tray 100. A plurality of fixing holder members 120 and a plurality of attaching members 150 are positioned on the tray and surrounding the substrate frame 130. The fixing holder members 120 have coupling holes 110.

Figure 5A:
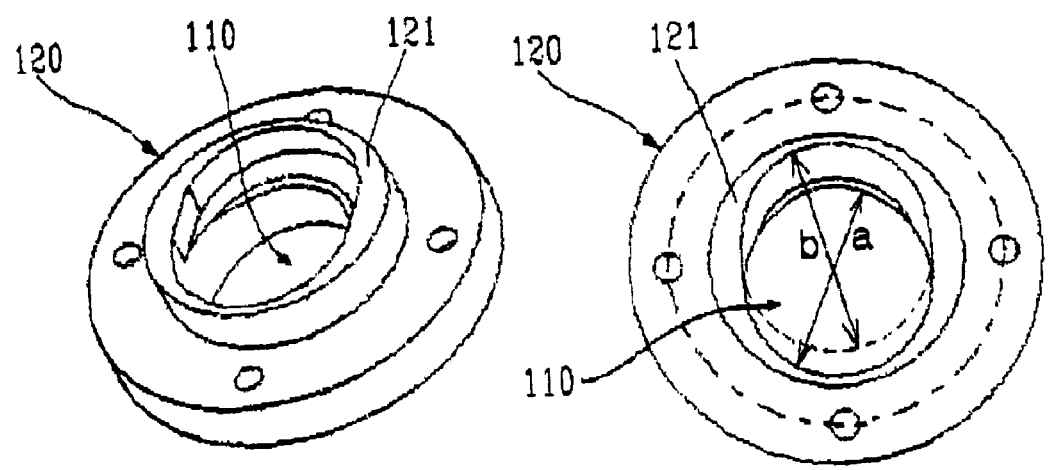
FIG. 5A shows a view of a fixing holder member of the tray aligning apparatus according to an embodiment of the present invention.

FIG. 5A shows a view of a fixing holder member of the tray aligning apparatus according to an embodiment of the present invention.

The fixing holder member 120 has a protruded step 121 formed along a portion of the inside surface of the coupling hole 110. The coupling hole 110 of the fixing holder member 120 has a circular circumference with an inner diameter a formed adjacent to the tray 100. The coupling hole 110 also has a circular circumference with an inner diameter b formed away from the tray 100 and defined by the protruded step 121. The inner diameter a and the inner diameter b can be unequal, and the inner diameter a can be larger than the inner diameter b so that the protruded step 121 is positioned along the upper edge of the coupling hole 110.

Figure 5B:
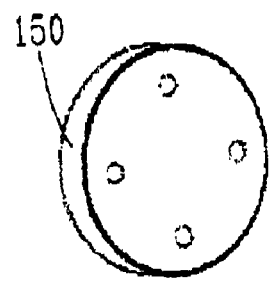
FIG. 5B shows a view of an auxiliary attaching member of the tray aligning apparatus according to an embodiment of the present invention.

FIG. 5B shows a view of an auxiliary attaching member of the tray aligning apparatus according to an embodiment of the present invention.

As described above, a plurality of attaching members 150 is positioned around the substrate frame 130 on the tray 100. An attaching member 150 is formed as a plate with a surface attached to the tray 100. Moreover, the attaching member 150 includes a surface extending away from the tray 100 that may include concave grooves or convex fine protrusions that correspond to relative members (to be described later) attached to the attaching members 150. The attaching members 150 can be formed of a conductive material, and, more specifically, can be formed of a magnetic material.

Figure 6A:
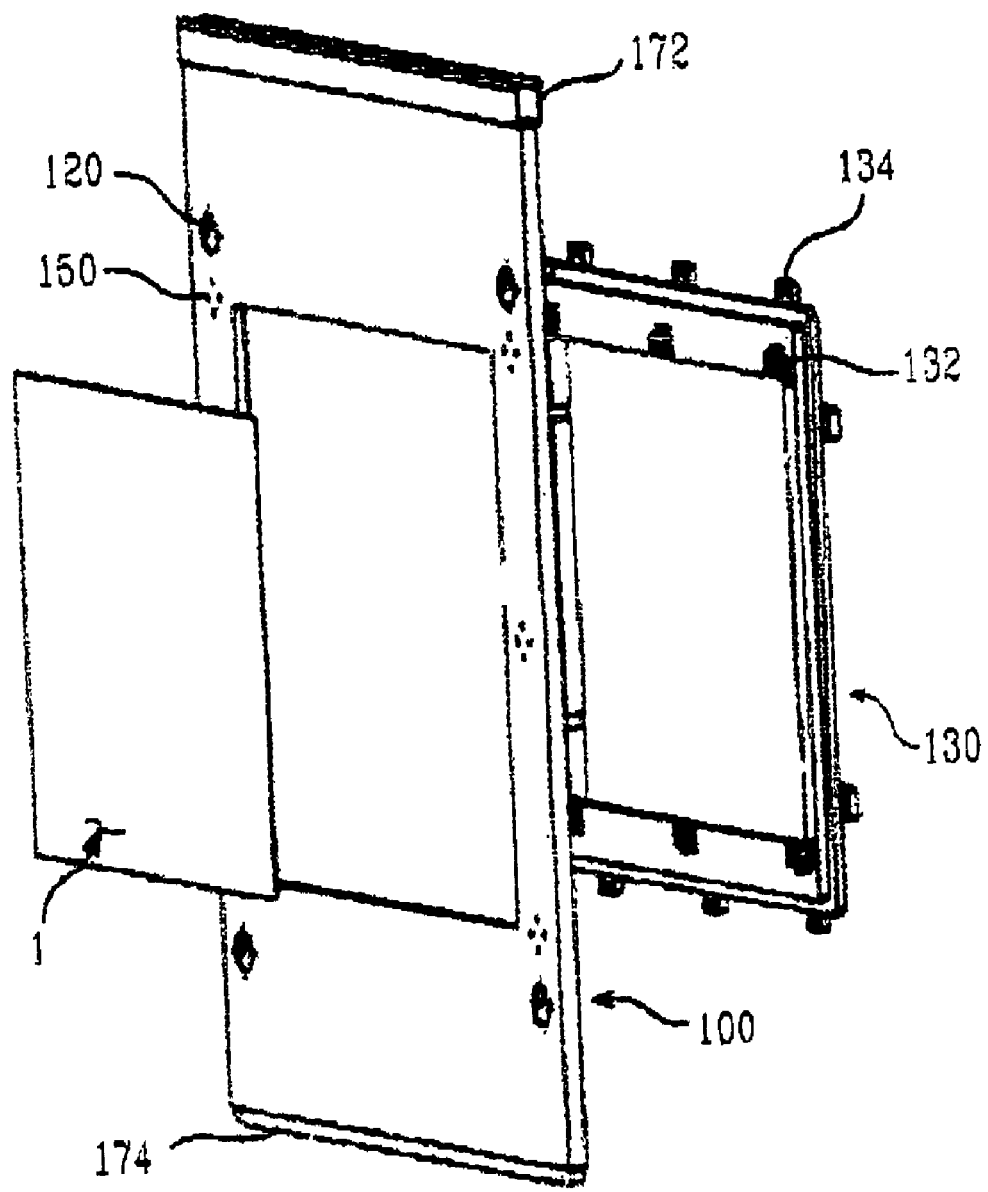
FIG. 6A shows a view of a substrate, a substrate frame, and a substrate supporting tray of a substrate supporting tray of the tray aligning apparatus according to an embodiment of the present invention.
Figure 6B:
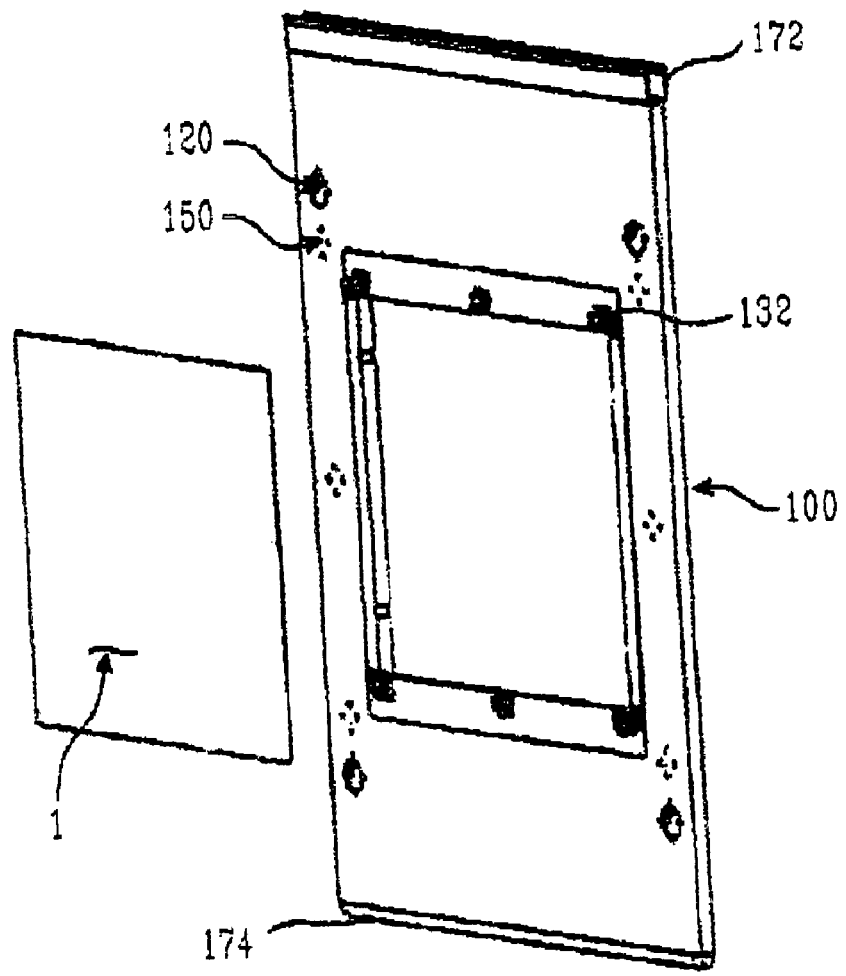
FIG. 6B shows a view of a substrate detached from the substrate supporting tray of the tray aligning apparatus according to an embodiment of the present invention.
Figure 6C:
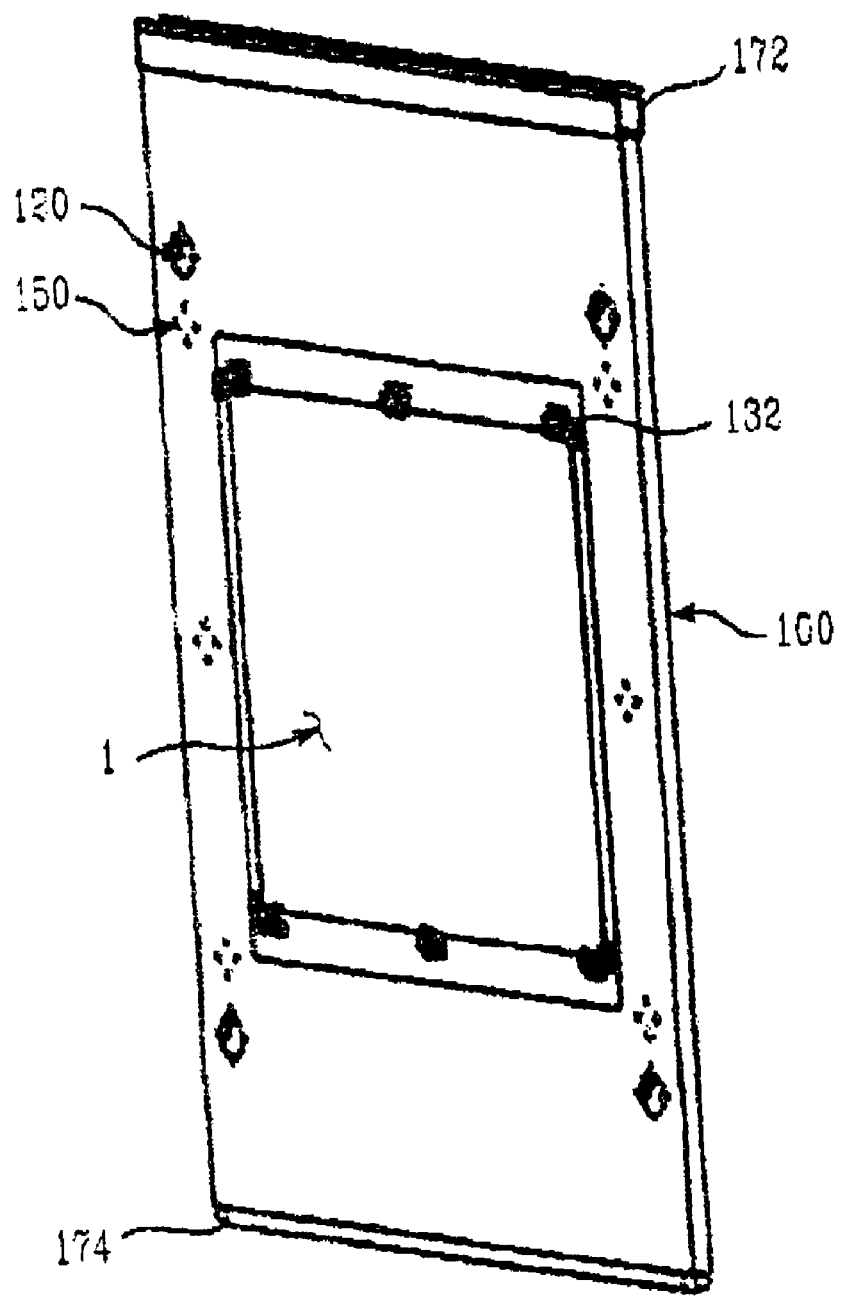
FIG. 6C shows a view of a substrate attached to the substrate supporting tray of the tray aligning apparatus according to an embodiment of the present invention.

FIG. 6A shows a view of a substrate, a substrate frame, and a substrate supporting tray of a substrate supporting tray of the tray aligning apparatus according to an embodiment of the present invention. FIG. 6B shows a view of a substrate detached from the substrate supporting tray of the tray aligning apparatus according to an embodiment of the present invention. FIG. 6C shows a view of a substrate attached to the substrate supporting tray of the tray aligning apparatus according to an embodiment of the present invention.

Referring to FIG. 6A to FIG. 6C, the substrate frame 130 is coupled with the front side of the tray 100, and the substrate 1 is coupled with the substrate frame 130 on the rear side of the tray 100. The substrate frame 130 is coupled with the opening formed in the center portion of the tray 100 and is fastened to the tray 100 by the frame supporting pieces 134. The substrate 1 is coupled with the opening formed in the center portion of the substrate frame 130 and is fastened to the substrate frame 130 by the substrate fixing pieces 132.

Figure 7A:
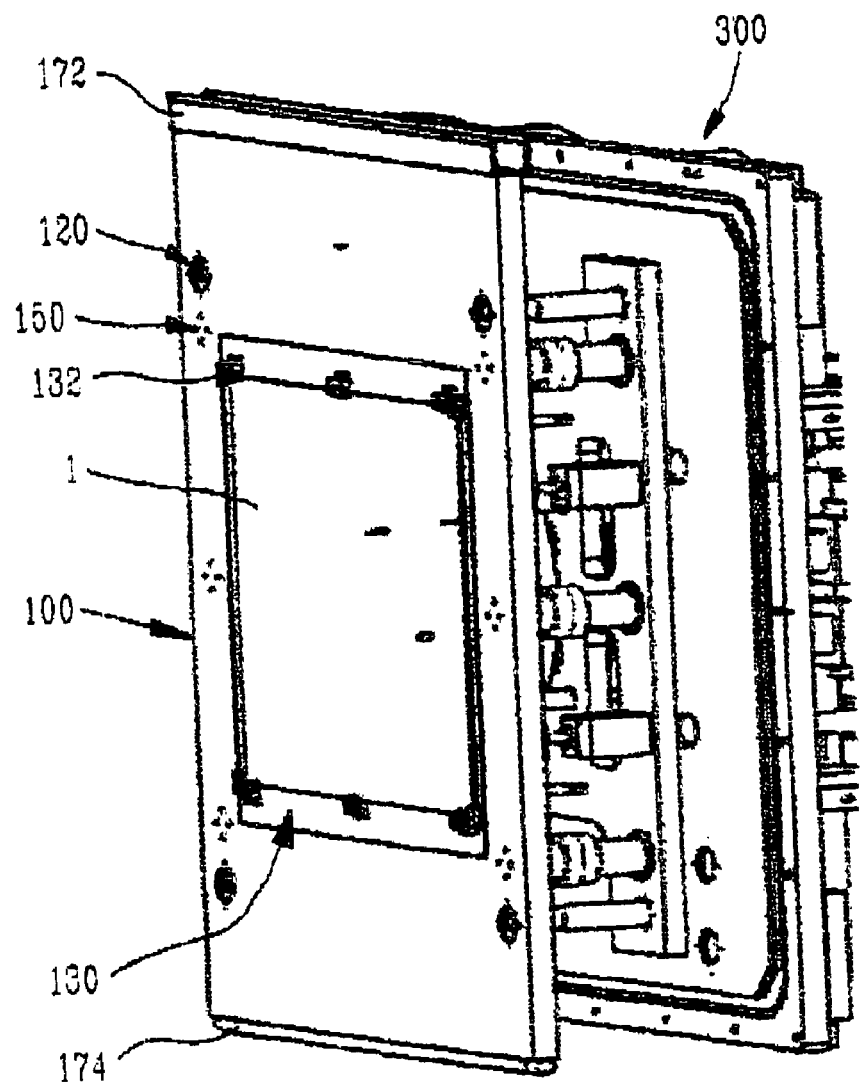
FIG. 7A shows a view of assembly of the substrate supporting tray and an aligning plate of the tray aligning apparatus according to an embodiment of the present invention.
Figure 7B:
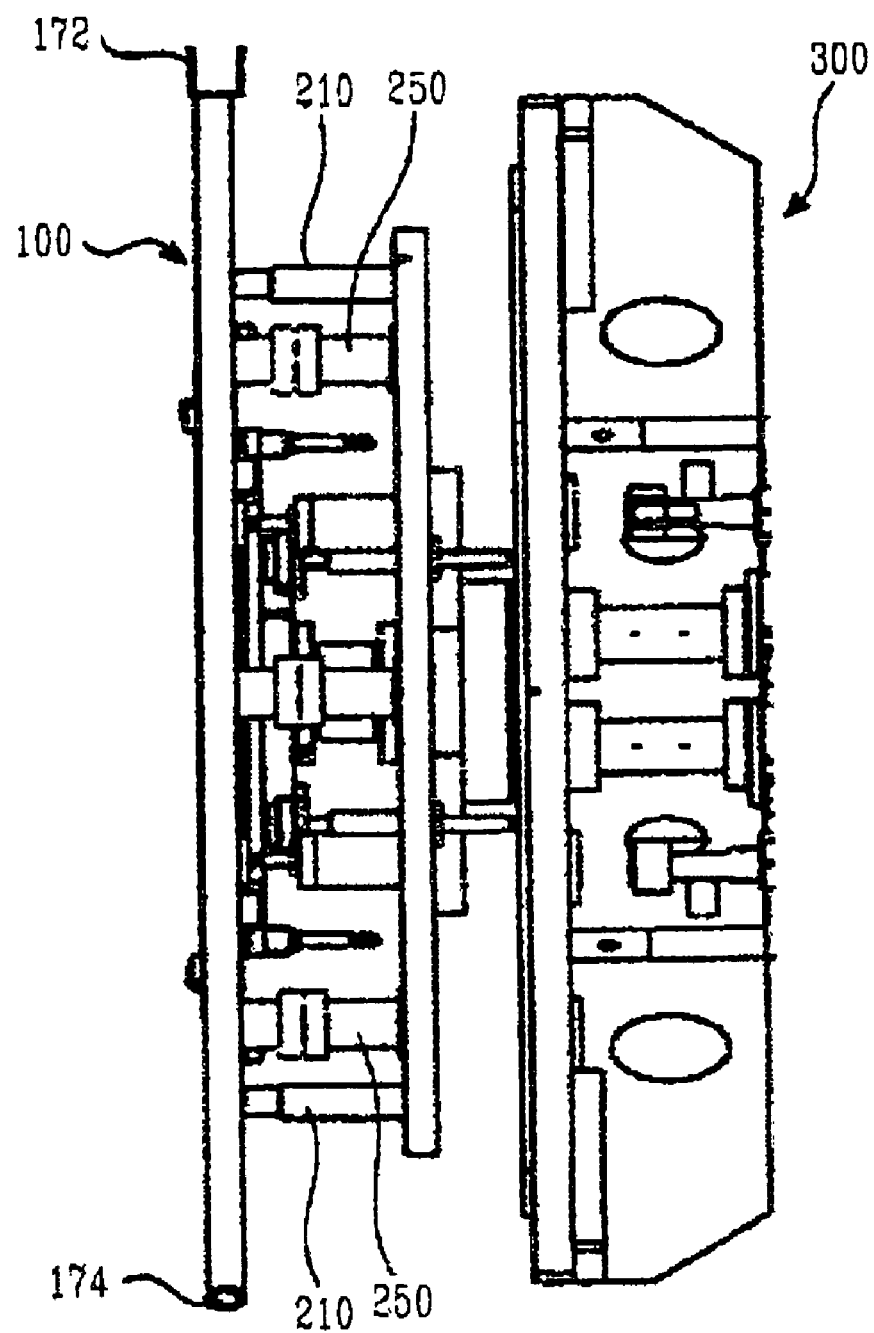
FIG. 7B shows a side view of assembly of the substrate supporting tray and an aligning plate of the tray aligning apparatus according to an embodiment of the present invention.

FIG. 7A shows a view of assembly of the substrate supporting tray and an aligning plate of the tray aligning apparatus according to an embodiment of the present invention. FIG. 7B shows a side view of assembly of the substrate supporting tray and an aligning plate of the tray aligning apparatus according to an embodiment of the present invention.

Referring to FIG. 7A, the tray 100 is fastened to an aligning plate 300 for vapor deposition. The aligning plate 300 includes a plate chuck (not shown) for positioning the substrate 1 adjacent to a shadow mask (not shown), a driving unit (not shown) coupled with the plate chuck to move the plate chuck, and coupling arm 210 corresponding to and coupled with the fixing holder members 120. The tray 100 attached to the aligning plate 300 can include the shadow mask (not shown) in which a pattern is formed, and attached on the surface facing the direction where evaporated material is introduced and the vapor deposition is performed so that the deposition pattern is formed according to the pattern formed in the shadow mask. Before forming the deposition pattern, the substrate 1 fastened to the tray 100 and the shadow mask are aligned. For the alignment, the aligning plate 300 can move the tray 100 in any direction to align the substrate 1 and the shadow mask.

Referring to FIG. 7B, the fixing holder members 120 of the tray aligning apparatus according to an embodiment of the present invention are coupled with the coupling arm 210 of the aligning plate 300, and the attaching members 150 of the tray 100 are coupled with supporting members 250 of the aligning plate 300.

The coupling arms 210 are inserted into the fixing holder members 120 of the substrate supporting tray 100 and are coupled with and fixed to the tray 100. The coupling arm 210 can include grooves 211a, 211b to receive protruding steps 121 of the fixing holder members 120.

The supporting members 250 can be formed of magnetic material and correspond to the attaching members 150 of the substrate supporting tray 100 to support and fix the substrate 1.

Figure 8A:
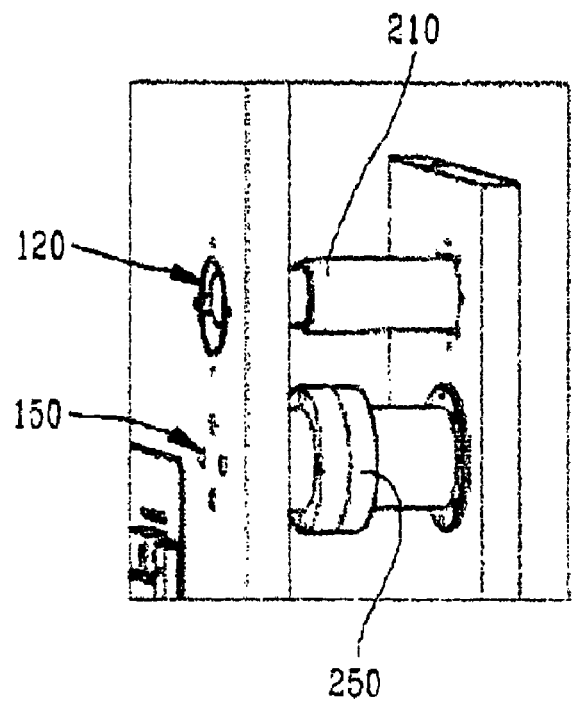
FIG. 8A shows a fixing holder member and the attaching member of the tray receiving the coupling arm and the supporting member of the aligning plate according to an embodiment of the present invention.
Figure 8B:
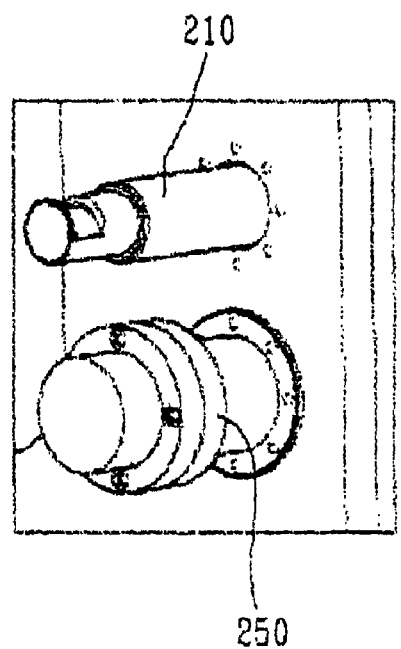
FIG. 8B shows the coupling arm and the supporting member of the aligning plate in the tray aligning apparatus according to an embodiment of the present invention.

FIG. 8A shows a fixing holder member and the attaching member of the tray receiving the coupling arm and the supporting member of the aligning plate according to an embodiment of the present invention. FIG. 8B shows the coupling arm and the supporting member of the aligning plate in the tray aligning apparatus according to an embodiment of the present invention.

Referring to FIG. 8A and FIG. 8B, the coupling arms 210 of the aligning plate 300 has a rod-like shape and a step with a reduced diameter in the protruding direction, that is, in the direction facing the tray 100. The step having a reduced diameter of the coupling arm 210 is sufficiently inserted into the inner diameter a (See FIG. 3A) of the coupling hole 110 of the fixing holder member 120. Additionally, the portion of the coupling arm 210 with the smaller diameter can have a semicircular groove formed in the side thereof.

When the substrate supporting tray 100 is attached to the aligning plate 300, the coupling arms 210 are inserted into the coupling holes 110 of the fixing holder members 120 corresponding to the coupling arms 210. When the portions of the coupling arms 210 with reduced diameter are inserted into the coupling holes 110 of the fixing holder members 120, the grooves formed in the reduced diameter portions of the coupling arms 210 are fitted into the surfaces forming the inner diameter a of the coupling holes 110 so that the surfaces forming the inner diameter b contact parts of the portions of the coupling arms 210 with reduced diameter. When the tray 100 is attached to the aligning plate 300, the coupling arms 210 are inserted into and fitted into the fixing holder members 120 so that the tray 100 is securely fastened and supported, whereby accurate alignment can be implemented.

The supporting members 250 of the aligning plate 300 have sufficient area to contact the attaching members 150 of the tray 100. A supporting member 250 can include a magnetic force generator (not shown) to attract an attaching member 150 made of conductive and magnetic material. After deposition is complete, to easily separate the attaching member 150 from the supporting member 250, the magnetic force generator can be an electromagnet.

When the tray 100 is attached to the aligning plate 300, the attaching members 150 can be attached to the supporting members 250 corresponding to the attaching members 150 so that the tray 100 can be securely fastened and supported, whereby accurate alignment can be implemented.

Additionally, in a supporting member 250 and an attaching member 150, grooves and protrusions formed on a contacting surface of the supporting member 250 and formed on a contacting surface of the attaching member 150 correspond to each other so that the tray 100 is guided to a position where the grooves and protrusions are aligned when attaching the tray 100. Further, the contact area between the tray 100 and the alignment frame 300 is increased to form a more secure and accurate attachment.

Hereinafter, operation of the tray aligning apparatus according to an embodiment is of the present invention will be described.

In an embodiment of the tray aligning apparatus as shown in FIG. 3A, the coupling grooves 211a, having the approximately vertical surfaces 212a and 214a and formed in the outer upper sides of the coupling arms 210, are coupled with the coupling protrusions 111a, 111b, having the approximately vertical surfaces 112a and 114a and formed in the coupling holes 110.

In an embodiment of the tray aligning apparatus as shown in FIGS. 3B and 3C, the coupling arms 210 formed in the tray holder 200 are inserted into the coupling holes 110 formed in the tray 100 so that the coupling grooves 211b with incline surface 212b coupled with coupling protrusions 111b with incline surface 112b.

The incline surface 212b of the coupling groove 211b and the incline surface 112b of the coupling protrusions 111b slide along each other so the vertical surface 214b of the coupling groove 211b contacts the vertical surface 114b of the coupling protrusion 111b.

Moreover, the coupling protrusions 111b are coupled with the coupling grooves 211b with minimal interposed clearance so that the coupling protrusions 111b are securely coupled with the coupling grooves 211b.

Hereinafter the tray aligning apparatus according to an embodiment of the present invention will now be described in detail with reference to the accompanying drawings.

Figure 9:
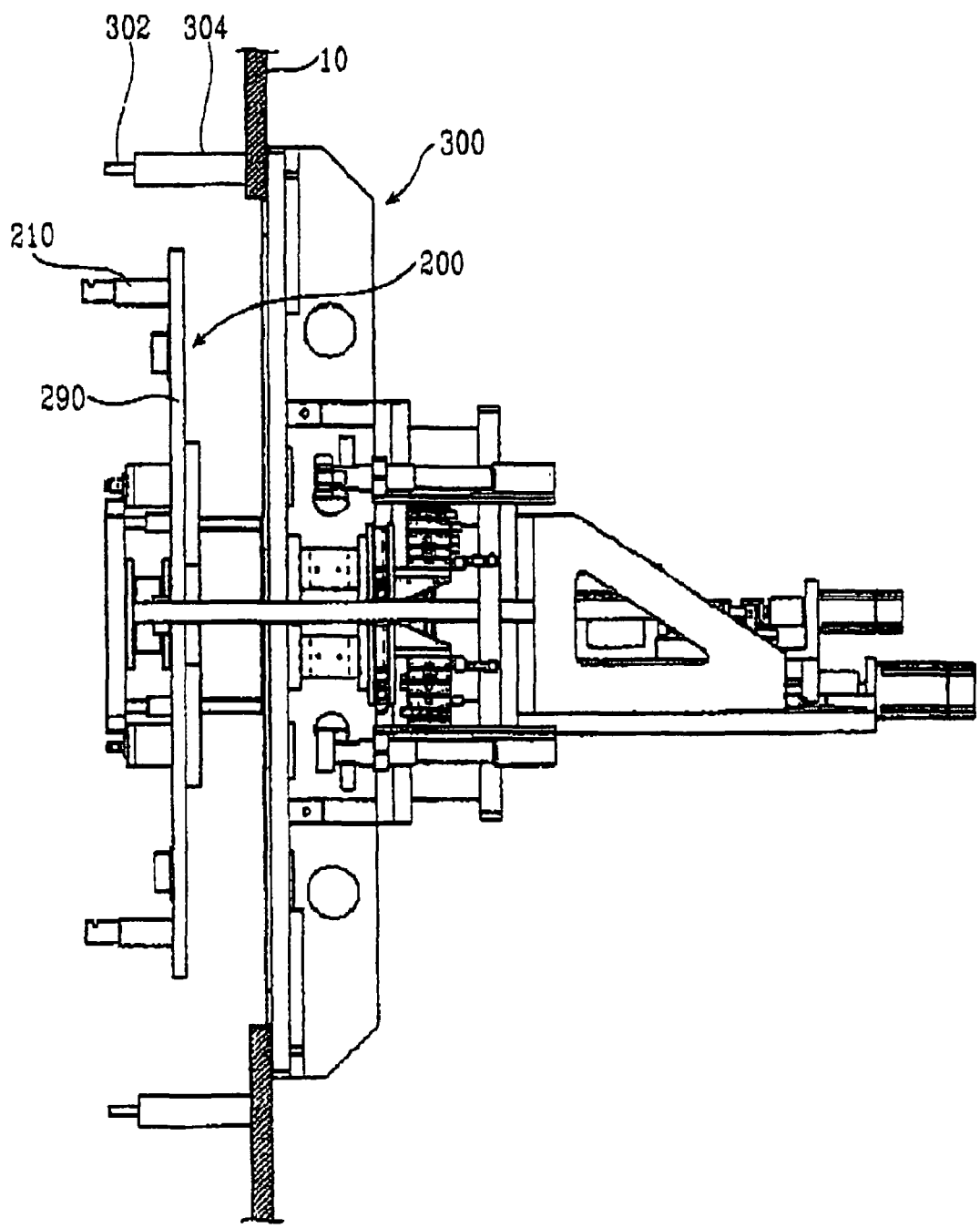
FIG. 9 shows a schematic side view of the tray aligning apparatus according to an embodiment of the present invention.
Figure 10:
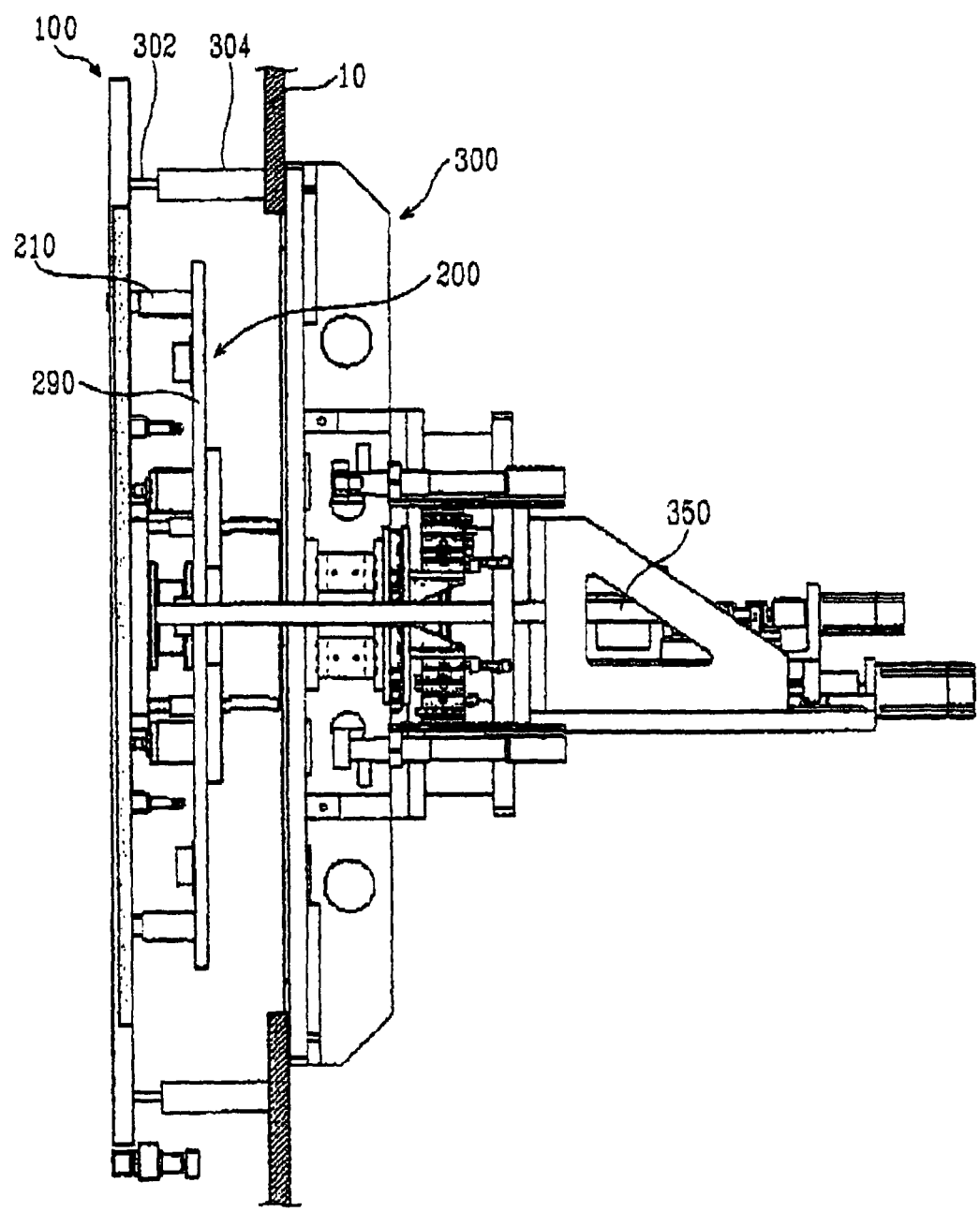
FIG. 10 shows a side view of the tray aligning apparatus according to an embodiment of the present invention as shown in FIG. 9.

FIG. 9 shows a schematic side view of the tray aligning apparatus according to an embodiment of the present invention. FIG. 10 shows a side view of the tray aligning apparatus according to an embodiment of the present invention as shown in FIG. 9.

The tray aligning apparatus according to an embodiment of the present invention includes a tray holder 200 coupled with the tray 100 such that the tray is fixed and positioned vertically, and supporting members 302 are positioned to prevent bending of the tray 100 coupled with the tray holder 200 while positioned vertically.

The tray holder 200 includes a holder plate 290 with the coupling arms 210 that extend away from the holder plate 290. Moreover, the tray holder 200 can be reciprocated by a separated driving device.

The tray holder 200 is coupled with the tray 100 while transferred in the vertical position. The coupling occurs by inserting the coupling arms 210 of the holder plate 290 into the coupling holes 110 formed in the tray 100.

The supporting members 302 are positioned along the circumference of the tray 100 while vertical to contact the side of the tray 100. The supporting members 302 contact the circumference and side of the tray 100 facing the tray holder 200.

The contact position between the supporting members 302 and the tray 100 can be formed along the outermost portion of the tray 100.

Alternately, the supporting members 302 may be disposed so one end contacting the tray 100 is positioned in the vacuum chamber and the other end is exposed to the exterior.

Moreover, the aligning plate 300 can include a driving source 304 for extending the length of a supporting member 302.

The driving source 304 can include a motor or a hydraulic cylinder so that the supporting member 302 extends and retracts to selectively contact the side of the tray 100. The driving source 304 changes the length of the supporting members 302 and can be fastened to a wall body 10 of the vacuum chamber. Moreover, the driving source 304 may be disposed inside or outside the vacuum chamber according to the shape or the position thereof.

Hereinafter, operation of the tray aligning apparatus according to an embodiment of the present invention will now be described.

When the tray 100 is coupled with the tray holder 200 and positioned vertically, the ends of the supporting members 302 extended by the driving source 304 attached to the wall of the wall body 10 of the vacuum chamber contact the side of the tray 100. Bending in the tray 100 due to the tray positioned vertically or force applied when the tray 100 is coupled with the tray holder 200 can be prevented by the supporting members 302 contacting the tray 100. Additionally, the length of each supporting member 302 can be changed by operation of the driving source 304 to suit the coupling position of the tray 100 so the supporting member 302 supports the tray 100.

Figure 11:
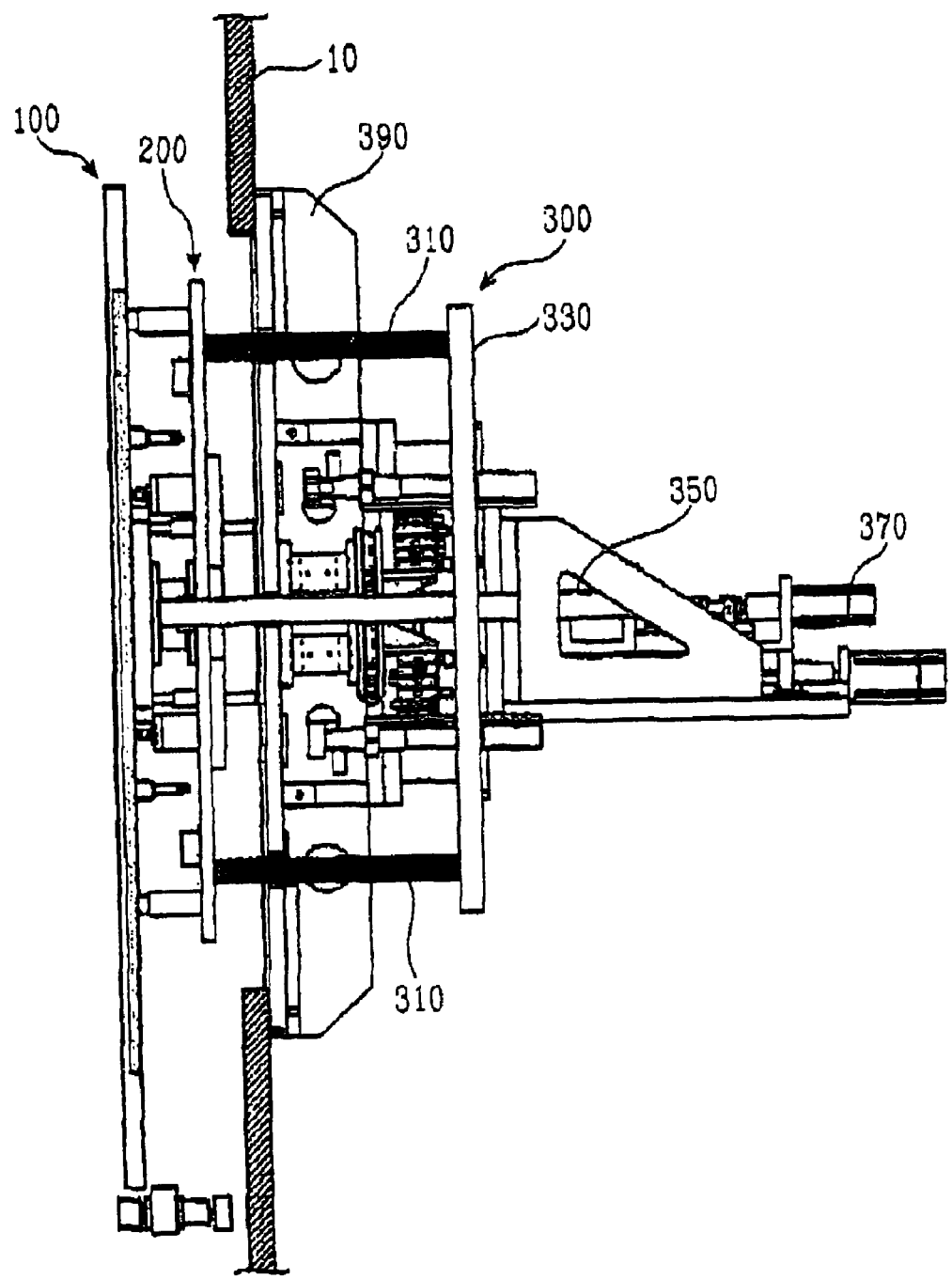
FIG. 11 shows a schematic side sectional view of a tray holder aligning apparatus according to an embodiment of the present invention.
Figure 12:
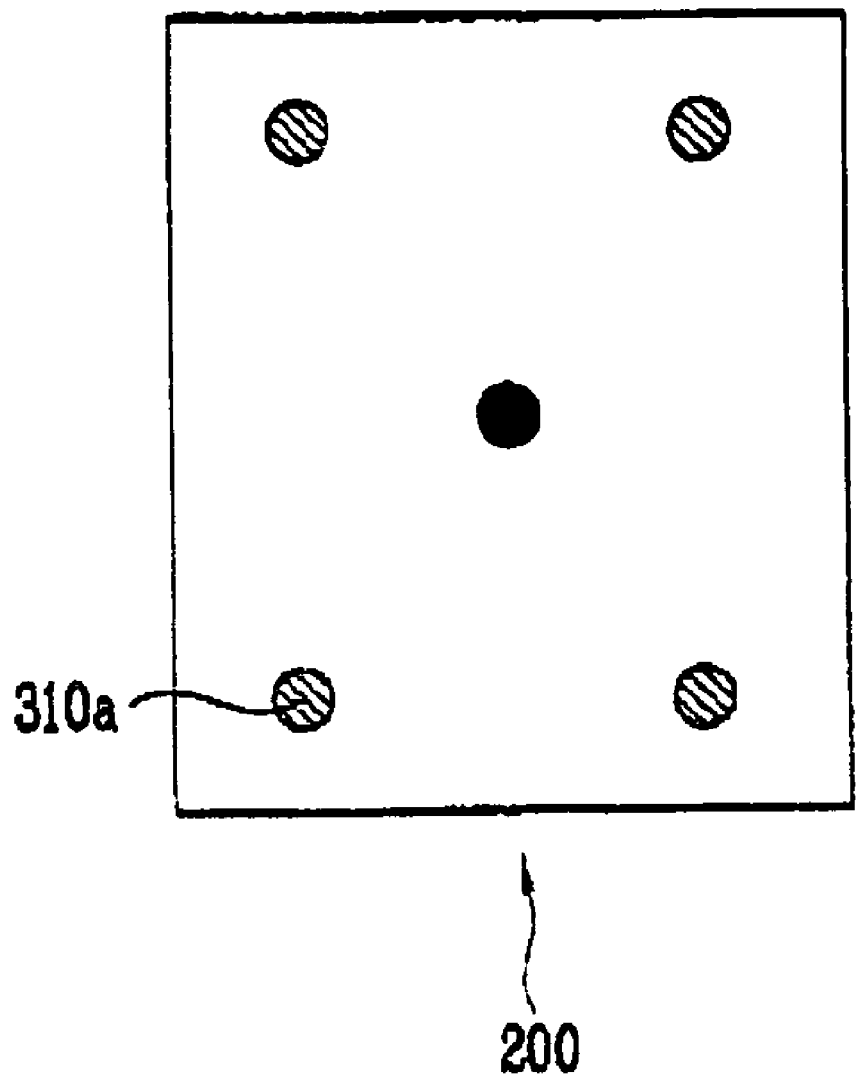
FIG. 12 shows contact positions of a guide shaft and a holder plate of the tray holder aligning apparatus in FIG. 11 according to an embodiment of the present invention.

FIG. 11 shows a schematic side sectional view of a tray holder aligning apparatus according to an embodiment of the present invention. FIG. 12 shows contact positions of a guide shaft and a holder plate of the tray holder aligning apparatus in FIG. 11 according to an embodiment of the present invention.

Hereinafter, the tray holder aligning apparatus according to an embodiment of the present invention will now be described in detail with reference to the accompanying drawings.

As shown in FIG. 11 and FIG. 12, the tray holder aligning apparatus includes a movable shaft 350 that penetrates the tray holder 200 so that the tray holder 200 positioned in the vacuum chamber is driven by an external driving source 370. One end of a guide shaft 310 can selectively contact the rear side of the tray holder 200.

At least one guide shaft 310 penetrates a stage 390 through which the movable shaft 350 penetrates to adjust the position of the movable shaft 350.

The guide shaft 310 can contact the circumference of the tray holder 200. Additionally, one or more guide shafts 310 can be positioned to support the lower side of the tray holder 200 so that downward bending of the tray holder 200 is reduced or prevented.

Moreover, two or more guide shafts 310 can be installed at symmetric positions around the tray holder 200. The symmetric positions can be determined with respect to a bending direction of the tray holder 200.

Contact portions 310a of the guide shafts 310 marked on the substrate tray 100, as shown in FIG. 12, are arranged at the four corners of the tray holder 200 so that two guide shafts 310 for supporting the upper side of the tray holder 200 prevent the upper side of the tray holder 200 from bending and two guide shafts 310 for supporting the lower side of the tray holder 200 prevent the tray holder 200 from bending, whereby the tray holder 200 maintains a substantially vertical state or at a desired angle of inclination.

The guide shafts 310 and the movable shaft 350 penetrate the stage 390.

Where a guide shaft 310 penetrates a frame 390 that is contacting the outer wall 10 of the vacuum chamber and maintaining the vacuum state of the vacuum chamber to support the tray holder 200, the guide shaft 310 and the frame 390 may use a magnetic liquid seal, which can also be used to seal the vacuum chamber around the movable shaft 350.

Where two or more guide shafts 310 are disposed to contact the tray holder 200, the ends of the guide shafts 310 outside the vacuum chamber can be coupled with a connection plate 330 so synchronized operation of the guide shafts 310 can occur.

One or more guide shafts 310 can be driven independently from the movable shaft 350 where a separate driving source (not shown), different from the driving source 370 for driving the movable shaft 350, may be installed to drive the guide shafts 310. Conversely, one or more guide shafts 310 may be driven by the driving source 370 for driving the movable shaft 350. In this manner, driving of the one or more guide shafts 310 is synchronized with the driving of the movable shaft 350.

When the guide shafts 310 are synchronized with the movable shaft 350, the guide shafts 310 and the movable shaft 350 are connected to the connection plate 330 so that movement of the movable shaft 350 is synchronized with movement of the guide shafts 310 by the driving source 370.

Where the guide shafts 310 and the movable shaft 350 operate independently, only the guide shafts 310 are connected to the connection plate 330 and driven by a separate driving source (not shown).

Hereinafter, the tray holder aligning apparatus according to an embodiment of the present invention will be described in brief.

By moving the movable shaft 350, driven by the driving source 370, the tray holder 200 moves in concert with the moveable shaft 350 and can be coupled with the substrate tray 100.

At that time, one or more guide shafts 310, positioned to contact the rear side of the tray holder 200, support the tray holder 200. The rear sides the guide shafts 310 can be coupled with the connection plate 330 so movements of the guide shafts 310 are synchronized, and depending on whether the connection plate 330 is coupled with the movable shaft 350, the guide shafts 310 can be driven simultaneously or independently with the tray holder 200.

According to the present invention, the coupling protrusions are securely coupled with the coupling grooves, and due to the coupling thereof, the substrate and the mask can be stably and accurately aligned.

Additionally, the bending of the tray coupled with the tray holder and positioned vertically is prevented and, due to the prevention of the bending of the tray, the substrate and the mask can be stably and accurately aligned, so that error caused by the misalignment is remarkably reduced.

Moreover, one end of each guide shaft can securely contact the rear side of the tray holder so that the bending of the tray holder is prevented and, due to the prevention of bending of the tray holder, the tray holder can be positioned vertically and can be accurately coupled with the tray.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An apparatus for aligning a tray and tray holder, comprising:
   a tray capable of receiving a substrate;
   a plurality of coupling holes formed in the tray, one of the plurality of coupling holes having a coupling protrusion;
   a tray holder; and
   a plurality of coupling arms coupled with the tray holder and extending away from the tray holder, one of the plurality of coupling arms corresponding to one of the plurality of coupling holes and having a coupling groove to engage the coupling protrusion, wherein the tray is coupled with the tray holder and can be transferred while positioned vertically when the coupling groove engages the coupling protrusion.

2. The apparatus for aligning a tray and tray holder of claim 1, wherein the coupling protrusion has an incline surface, and the coupling groove has an incline surface to contact the coupling protrusion incline surface when the coupling groove engages the coupling protrusion.

3. The apparatus for aligning a tray and tray holder of claim 2, wherein the coupling protrusion has a vertical surface, and the coupling groove has a vertical surface to contact the coupling protrusion vertical surface when the coupling groove engages the coupling protrusion.

4. The apparatus for aligning a tray and tray holder of claim 1, further comprising:
a fixing holder member formed in the tray.

5. The apparatus for aligning a tray and tray holder of claim 4, wherein the tray holder comprises:
a chuck for positioning the tray;
a driving unit coupled with the chuck to drive the chuck; and
a fixing and inserting member corresponding to the fixing holder member,
wherein the fixing and inserting member couples with the fixing holder member to couple the tray with the tray holder.

6. The apparatus for aligning a tray and tray holder of claim 4, wherein the fixing holder member includes a through-hole formed by overlapping two rings with different diameters.

7. The apparatus for aligning a tray and tray holder of claim 6, wherein a ring with a smaller diameter is positioned above a ring with a larger diameter.

8. The apparatus for aligning a tray and tray holder of claim 5, wherein the fixing and inserting member has a groove for coupling the fixing and inserting member with the fixing holder member.

9. The apparatus for aligning a tray and tray holder of claim 5, wherein the tray further includes an attaching member, the tray holder further includes a supporting member corresponding to the attaching member, and the attaching member couples with the supporting member when the tray couples with the tray holder.

10. The apparatus for aligning a tray and tray holder of claim 9, wherein the attaching member comprises a conductive material.

11. The apparatus for aligning a tray and tray holder of claim 10, wherein the conductive material includes a magnetic material.

12. The apparatus for aligning a tray and tray holder of claim 11, wherein the attaching member includes at least one groove or protrusion.

13. The apparatus for aligning a tray and tray holder of claim 12, wherein the supporting member is made of magnetic material and can magnetically couple with the attaching member.

14. The apparatus for aligning a tray and tray holder of claim 4, wherein the tray comprises: a substrate frame for receiving and supporting a substrate, the tray capable of receiving and supporting the substrate frame.

15. The apparatus for aligning a tray and tray holder of claim 14, wherein the substrate frame further comprises:
a substrate fixing piece for receiving and supporting the substrate.

16. The apparatus for aligning a tray and tray holder of claim 15, wherein the substrate frame further comprises:
a frame fixing piece for coupling the substrate frame with the tray.

17. The apparatus for aligning a tray and tray holder of claim 16, wherein the tray further comprises:
a transfer device for transferring the tray while in the vertical position.

18. The apparatus for aligning a tray and tray holder of claim 17, wherein the tray further comprises:
a guide device positioned along the upper side surfaces of the tray.

19. An apparatus for aligning a tray and tray holder, comprising:
a tray holder, to which a tray can be coupled to position the tray vertically; and
a supporting member for supporting the tray when the tray is coupled with the tray holder,
wherein the supporting member extends toward the tray by a driving source, and
wherein the driving source is positioned along an inner surface of a wall body of a vacuum chamber.

20. An apparatus for aligning a tray and tray holder, comprising:
a driving unit in which a tray holder is coupled with one end of a movable shaft driven by a driving source;
a coupling part including coupling arms, the coupling arms coupled with the tray holder and capable of coupling with a vertically positioned tray; and
a first guide shaft,
wherein a first end of the first guide shaft is coupled with the tray holder, and the guide shaft prevents bending of the tray holder.

21. The apparatus for aligning a tray and tray holder of claim 20, further comprising:
a second guide shaft,
wherein the first guide shaft is positioned at the upper side of the tray holder and the second guide shaft is positioned at the lower side of the tray holder.

22. The apparatus for aligning a tray and tray holder of claim 21, further comprising:
a connection plate coupled with the movable shaft, the first guide shaft, and the second guide shaft.

23. The apparatus for aligning a tray and tray holder of claim 22, wherein the driving source drives the movable shaft, the first guide shaft, and the second guide shaft simultaneously to move the same distance.

24. The apparatus for aligning a tray and tray holder of claim 22, wherein the first guide shaft are simultaneously driven by a separate driving source and are driven independently from the movable shaft.

25. The apparatus for aligning a tray and tray holder of claim 20, further comprising:
a liquid magnetic seal,
wherein the first guide shaft passes through a wall of a vacuum chamber and the liquid magnetic seal is positioned to maintain a vacuum in the vacuum chamber.

* * * * *